United States Patent [19]

Shimanoe et al.

[11] Patent Number: 4,906,550
[45] Date of Patent: Mar. 6, 1990

[54] METHOD OF PRODUCING POLYDIACETYLENE THIN FILM

[75] Inventors: Kengo Shimanoe, Kawasaki; Tetsuo Sakamoto, Chiyoda; Masao Sakashita, Kawasaki, all of Japan

[73] Assignee: Nippon Steel Corporation, Tokyo, Japan

[21] Appl. No.: 224,011

[22] Filed: Jul. 25, 1988

[30] Foreign Application Priority Data

Jul. 24, 1987 [JP] Japan .................. 62-183437
Nov. 25, 1987 [JP] Japan .................. 62-295022
Jun. 10, 1988 [JP] Japan .................. 63-141483

[51] Int. Cl.[4] .................. G03C 1/90; G03C 1/68
[52] U.S. Cl. .................. 430/260; 430/257; 430/270; 430/311; 430/327; 430/942; 526/285
[58] Field of Search .............. 430/257, 260, 270, 327, 430/311, 942; 526/285

[56] References Cited
U.S. PATENT DOCUMENTS

| 4,291,118 | 9/1981 | Boduch | 430/313 |
| 4,528,261 | 7/1985 | Hauser | 430/322 |
| 4,562,141 | 12/1985 | Tieke | 430/281 |
| 4,627,029 | 12/1986 | Wilson et al. | 365/107 |
| 4,721,769 | 1/1988 | Rubner | 528/75 |
| 4,830,952 | 5/1989 | Penner et al. | 430/287 |

FOREIGN PATENT DOCUMENTS 58-111029 5/1983 Japan .
62-1701 4/1987 Japan .

OTHER PUBLICATIONS

Lieser et al., "Thin Solid Films", 68, 77–90, (1980).
Sakashita et al., "J. Electroanal. Chem.", 140, 75–89, (1982).
Sakashita et al., "Electrochemical Science and Technology", 129 (4), pp. 739–746, Apr. 1982.
Sakashita et al., "Electrochemical Science and Technology", 129 (8), pp. 1710–1716, Aug. 1982.

Primary Examiner—Roland E. Martin
Assistant Examiner—C. D. RoDee
Attorney, Agent, or Firm—Wenderoth, Lind & Ponack

[57] ABSTRACT

A method of producing a polydiacetylene thin film comprises spreading on a water surface a diacetylene compound having one or more conjugated diacetylene groups, subjecting the diacetylene compound to incomplete polymerization by irradiation with ultraviolet rays to an extent incapable of causing complete polymerization, transferring the spread film to a substrate to form a monolayer or built-up film thereon, and irradiating the transferred film with ultraviolet rays or an electron beam to complete the polymerization thereof.

7 Claims, 3 Drawing Sheets (A)　　　　　(B)

METHOD OF PRODUCING POLYDIACETYLENE THIN FILM

BACKGROUND OF THE INVENTION

1. Field of the Invention

This invention relates to a method of producing a thin film of polydiacetylene compounds. The invention particularly relates to a method of producing a thin film of polydiacetylene compounds with few defects and exhibiting excellent mechanial strength and more particularly to a method of producing such a thin film of polydiacetylene compounds by building up spread films on water surfece of diacetylene compounds on a substrate by Langmuir-Blodgett's technique or the like.

The invention can be applied for the formation of ultra-thin insulating films as well as in conjunction with ultra-thin film lithography. Specifically, it can be used for building up patterned thin films on a substrate of mercury cadmium telluride or cadmium telluride, thereby to obtain a high-precision patterned passivation film exhibiting excellent mechanical strength.

2. Description of the Prior Art

Diacetylene compounds having one or more conjugated groups in the molecule thereof can be polymerized by irradiation with ultraviolet rays or an electron beam, and it has been proposed to apply polydiacetylene compounds obtained in this way as resist materials in lithography processes, electrical insulating films in MIS (Metal Insulator Semiconductor) type junction devices and passivation films used following the formation of semiconductor circuit wiring.

Heretofore known methods of producing thin films of polydiacetylene compounds include Langmuir-Blodgett's technique, the horizontal lifting method and the rotational lifting method, wherein a monolayer or a built-up film is produced by dripping onto a water surface a diacetylene compound solution obtained by dissolving a diacetylene compound in a solvent such as chloroform, evaporating the solvent, and forming a monolayer by pressing the so-obtained spread film at a prescribed surface pressure while at the same time transferring it to a substrate. Where the so-formed whin film of diacetylene compounds is to be used for forming a resist film, the practice has been first to form a built-up film on the substrate in a dark environment and then to convert the diacetylene compound film into a polymer thin film by irradiation with patterned ultraviolet rays. (See, for example, Japanese Patent Unexamined Disclosure No. 58(1983)-111,029.)

On the other hand, where the thin film of diacetylene compounds is to be used for forming an ultra-thin insulating film, it has been the practice to complete the polymerization while the film is spread on the water surface and then transfer it to the substrate (see Japanese Patent Unexamined Publication No. 62(1987)-1701), or alternatively to build up a number of unpolymerized spread films on a substrate and thereafter polymerize them, in either case thereby obtaining a thin film of polydiacetylene compounds.

When a diacetylene compound having the skeletal structure shown in FIG. 2(A) is converted by irradiation with ultraviolet rays or an electron beam to a diacetylene polymer as shown in FIG. 2(B), a change occurs in the orientation angular of the diacetylene molecules. This structural change is accompanied by a contraction of the diacetylene compound. As a result cracks occur in the polymer thin film and divide its surface into island-like regions called domains. These domains have been reported to measure from several micrometers to several millimeters (Günter Lieser et al, Thin Solid Films, 68(1980) 77~90). The formation of these domains results in the presence of defects in the polydiacetylene compound thin film formed on the substrate so that regardless of whether the thin film is used as an ultra-thin insulating film or as an ultra-thin protection film for a resist material, it becomes an important matter from the practical standpoint to decrease domain formation.

As regards application as a protective film on a semiconductor, while good insulating films can be obtained on GaAs, InP, ZnS, ZnSe and SiC since these are amenable to ordinary sputtering, chemical vapor deposition and other such processes, it is not possible to obtain satisfactory insulating films on mercury cadmium telluride or cadmium telluride by these process since the heat they involve damages these semiconductor materials. There is thus a need for a film-forming method which does not cause damage to such semiconductor materials. Further, in use of these semiconductor materials for the production of semiconductor devices, there ordinarily arises the problem of the presence of native oxides and excess tellurium caused by etching on the surface of the semiconductor substrate, which tends to degrade device characteristics. Consideration must therefore also be given to the method of treating the substrate.

SUMMARY OF THE INVENTION

One object of the present invention is to provide a method of producing a thin film of polydiacetylene compounds wherein the degree of polymerization of a diacetylene compound film spread on a water surface is controlled, the spread film is then transferred to a substrate as a monolayer or a built-up film (these two sometimes being referred to collectively simply as a "built-up film" herein) and the polymerization of the built-up film of diacetylene compound is thereafter completed, whereby there is obtained a thin film of polydiacetylene compounds with few defects.

Another object of the invention is to use the aforesaid method for forming a good passivation film on a substrate of n- or p-type cadmium mercury telluride or cadmium telluride which has been subjected to surface cleaning pretreatment.

In accordance with the present invention, a diacetylene compound having one or more conjugated diacetylene groups is first spread on a water surface. Then, while the spread film is being pressed, it is simultaneously subjected to incomplete polymerization by irradiation with ultraviolet rays to an extent incapable of causing complete polymerization. Next it is transferred to a substrate to form a monolayer or built-up film thereon and is then irradiated with ultraviolet rays or an electron beam to complete the polymerization thereof and obtain a thin film of polydiacetylene compounds.

The completely polymerized thin film of polydiacetylene compounds is insoluble in organic solvents capable of dissolving diacetylene compounds. In this invention, the incompletely polymerized thin film obtained by exposure to an amount of ultraviolte irradiation incapable of causing complete polymerization is defined as one which is soluble in a solvent for the diacetylene compound and does not include one that has become insoluble in such a solvent because of exposure to a relatively large amount of ultraviolet radiation.

The polymerization of the incompletely polymerized built-up film can be completed by, for example, patterned irradiation with ultraviolet rays or an electron beam. After the built-up film has been subjected to such patterned irradiation, the remaining incompletely polymerized portions thereof can be removed by dissolution in a solvent. Thus it is possible to obtain not only a continuous polydiacetylene thin film but also one that is patterned.

The diacetylene compounds that can be used in the present invention are not particularly limited, the only requirement being that they must include one or more conjugated diacetylene groups ($-C\equiv C-C\equiv C-$) in the molecule thereof and have a $-COOH$ or other hydrophilic group at one end of the molecule and a $-CH_3$ or other hydrophobic group at the other end thereof. A monolayer of such compounds can be built up on a substrate by a known method such as Langmuir-Blodgett's technique.

Examples of such diacetylene compounds include 10,12-tricosadiynic acid, 10,12-pentacosadiynic acid and 10,12-heptacosadiynic acid.

A film-forming solution can be obtained by dissolving one of these diacetylene compounds in an organic solvent therefor which is not compatible with water. As the most typical organic solvents used for preparation of the film-forming solution there can be mentioned chloroform and the like. The film-forming solution is dripped onto a water surface in minute quantities at a time to form a thin spread liquid phase thereon. This is then pressed using a barrier or the like so as to obtain a monolayer with a prescribed surface pressure.

In the method of producing a thin film of a polydiacetylene compound of this invention, the diacetylene compound monolayer spread on the water surface and having a prescribed surface pressure is irradiated with ultraviolet rays to obtain a spread film of polymerized polydiacetylene. At this time, if the irradiation is carried out using ultraviolet rays of a wavelength of 200 nm–400 nm at an irradiation energy per unit area (cm$^2$) of 10 mW–200 mW for 1 sec to 10 min, the amount of irradiation will be insufficient for complete polymerization and there will be obtained a spread film of incompletely polymerized polydiacetylene.

While as a matter of principle, it is alternatively possible to obtain the incompletely polymerized polydiacetylene film by irradiation with an electron beam in place of the ultraviolet rays, use of ultraviolet rays is preferable from the point of the simplicity and safety of the equipment used.

Unpolymerized diacetylene, incompletely polymerized polydiacetylene and completely polymerized polydiacetylene can be distinguished based on the visible light absorption spectrum of the built-up layer transferred to the substrate.

By way of example, FIG. 1 shows a comparison of the absorption spectra for an unpolymerized built-up film, an incompletely polymerized built-up film and a completely polymerized built-up film in the case of using 10,12-heptacosadiynic acid.

In this figure, the spectrum 1 is that for an unpolymerized built-up film, the spectra 2 and 3 are for incompletely polymerized built-up films and spectrum 4 is for a completely polymerized built-up film. The difference between the spectra 2 and 3 is the result of a difference in the surface pressure at the time the irradiation with ultraviolet rays was conducted on the water surface. In the case of a low surface pressure, absorption was exhibited in the vicinity of 590 nm and 650 nm (spectrum 3), whereas in the case of a high surface pressure, absorption was exhibited in the vicinity of 490 nm and 530 nm (spectrum 2). The main difference between spectrum 4 for the completely polymerized built-up film and spectrum 2 is the spectrum absorption intensity, and it will be noted that the spectrum absorption intensity for the incompletely polymerized built-up film is considerably lower than that for the completely polymerized built-up layer.

In this invention the incompletely polymerized polydiacetylene spread on the water surface at a prescribed surface pressure is transferred to a substrate to form a built-up film. The surface pressure ($\pi$) range is preferably not more than 80 dyne/cm. When the surface pressure exceeds 80 dyne/cm, the spread film disintegrates and no longer exits as a monolayer. On the other hand, the surface pressure may be low within the range in which an effective monolayer is formed. The absorption spectrum indicative of the degree of polymerization varies depending on the surface pressure. At a low surface pressure ($\pi < 30$ dynes/cm), there is obtained the spectrum 2 of FIG. 1, while at a high surface pressure ($30 \leq \pi \leq 80$ dyne/cm), there is obtained the spectrum 3 of FIG. 1. However, the variation in spectrum with surface pressure differs depending on the type of diacetylene compound.

The conventional methods can be applied as regards both the types of substrate on which the diacetylene can be built up and the method of transfer used. However, as regards the surface pressure at the time of building up the incompletely polymerized film, in the case where incomplete polymerization was carried out at a low surface pressure, the pressure should preferably be increased in order to increase the packing density, and in the case where incomplete polymerization was carried out at high surface pressure, the pressure should be left as is since the packing density is already high.

The built-up layer consists, for example, of a structure in which the first layer (the undermost monolayer) has its hydrophilic groups directed toward the substrate, a structure in which the first layer (the undermost monolayer) has its hydrophobic groups directed toward the substrate, a structure in which the first and other odd numbered layers of the built-up film have their hydrophilic groups directed toward the substrate side and the second and other even numbered layers have their hydrophobic groups directed toward the substrate side, or a structure in which the first and other odd numbered layers of the built-up film have their hydrophobic groups directed toward the substrate side and the second and other even numbered layers have their hydrophilic groups directed toward the substrate side. The number of built-up layers is preferably between one and one hundred.

In the method of producing a thin film of polydiacetylene compounds according to this invention, the film built-up by transferring incompletely polymerized diacetylene compounds onto a substrate is converted into a thin film of polydiacetylene by subjecting it to an adequate amount of ultraviolet irradiation. Alternatively, however, instead using ultraviolet rays the complete polymerization can be carried out by irradiation with an electron beam in a vacuum. Moreover, the processing for completing polymerization conducted by irradiation with ultraviolet rays or an electron beam can be carried out either with respect to the entire area of the incompletely polymerized film or with respect to selected parts of the total area thereof in the form of a desired pattern. While the method of completing the polymerization by use of ultraviolet rays is advantageous in terms of the simplicity of the required apparatus, the method of completing the polymerization by use of an electron beam provides superior lithographic resolution. Thus, which of these methods should be selected will depend on the purpose of the lithographic patterning.

The method of producing a thin film of polydiacetylene compounds according to the present method is characterized in that it comprises two stages of polymerization: a first stage in which a diacetylene compound spread into a film at a prescribed surface pressure is incompletely polymerized and a second stage in which the spread film of incompletely polymerized diacetylene compound is, after having been transferred to a substrate, converted into a completely polymerized film. As a result, compared with the conventional single-stage polymerization methods of carrying out polymerization after formation of the built-up film or of forming the built-up layer after complete polymerization, the method of the present invention reduces the amount of morphological change in the thin built-up film resulting from structural change at the time of polymerization and enables a decrease in the number of defects in the obtained thin film. As a result, the electrical resisitance of the thin film in the direction of thickness is increased and the chemical protection performance thereof is enhanced.

Moreover, the built-up film of the incompletely polymerized diacetylene compound produced in the course of the process of the invention is soluble in some solvents so that after lithographic patterning has been conducted by irradiation with ultraviolet rays or an electron beam for complete polymerization, the incompletely polymerized portions remaining at the regions can be dissolved away to obtain the desired pattern.

It is possible to fabricate semiconductor devices in which the polydiacetylene film according to the invention serves as a protective film. In this case, either the contact electrodes of the device are provided on the substrate before the aforesaid polydiacetylene compound thin film is formed thereon or the contact electrodes are provided on the device after conducting patterned irradiation and then removing the incompletely polymerized portions of the thin film of polydiacetylene compounds.

In particular, for obtaining a thin film of polydiacetylene compounds to serve as an insulating film on cadmium mercury telluride or cadmium telluride semiconductors, the surface of the semiconductors is subjected to cleaning beforehand.

As was explained earlier, this cleaning pretreatment is carried out to free the surface of the semiconductor substrate from native oxides and excess tellurium arising in the device fabrication process and thus to enhance the adherence between the thin film of polydiacetylene compound and the substrate.

Any of various methods can be adopted for this cleaning pretreatment. For example, the surface of the compound semiconductors can be mechanically polished or chemically etched, or mechanically polished and then chemically etched. In the present invention, however, it is preferable to first carry out mechanically polishing and/or chemically etching and then to further clean the semiconductor surface by subjecting the semiconductors to electrochemical cathodic reduction in an aqueous solution of a pH between 4 and 9.

As the aqueous solution in this case there is used, for example, an acetic acid-acetate buffer solution or a phosphoric acid-phosphate buffer solution deaerated with an inert gas such as Ar or $N_2$. The reduction potential used is $-0.2$ to $-1.0$ V in the case of using a silver-silver chloride reference electrode and the reduction is continued until the current density falls to or below 1 $\mu A/cm^2$.

The electrochemical cathodic reduction of the mercury cadmium telluride or cadmium telluride substrate following mechanical polishing and/or chemical etching thereof and the method of producing a polydiacetylene compound thin film according to this invention facilitate the building up of a polydiacetylene compound thin film, enable formation of a chemically stable insulating film having a high electrical resistance without damage to the substrate, and enhance the electrial characteristics of the semiconductor device concerned.

DESCRIPTION OF THE PREFERRED EMBODIMENTS

EXAMPLE 1

10,12-heptacosadiynic acid selected as the diacetylene compound was dissolved in chloroform and this diacetylene compound solution was dripped onto a water surface using a Langmuir-Blodgett apparatus to obtain a spread film. The chloroform was then evaporated off.

Figure 1:
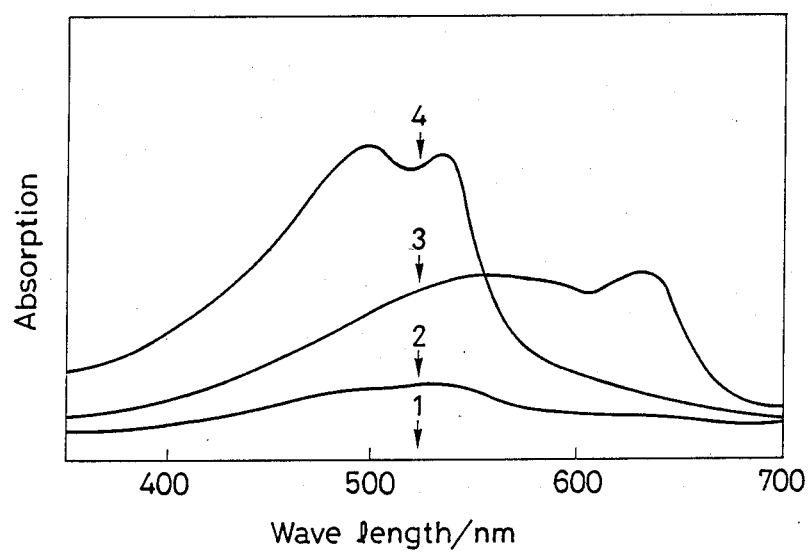
FIG. 1 shows the absorption spectra of a diacetylene compound and polymers thereof.
Figure 2:
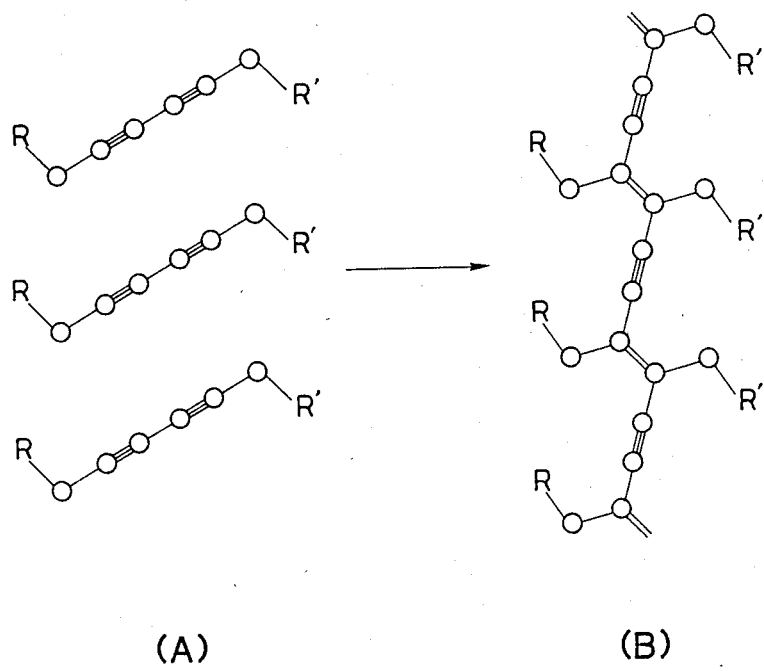
FIG. 2 is an explanatory view showing structural changes occurring in polymerization of a diacetylene compound, wherein (A) and (B) are respectively the structure before and after polymerization.

Next, the surface pressure was adjusted to 5 dyne/cm and ultraviolet rays were irradiated onto the spread film surface at 60 mW/cm$^2$ for 30 sec, whereby there was obtained an incompletely polymerized spread film of 10,12-heptacosadiynic acid. Then after the surface pressure had been adjusted to 35 dyne/cm, five layers of the spread film were built up on a glass substrate having an Al contact electrode evaporated thereon, with the substrate transfer velocity set at 2 mm/min for the first layer and 12 mm/min for the further layers. The measured absorption spectrum is shown in FIG. 1 (3). The substrate was again irradiated with ultraviolet rays, at 60 mW/cm$^2$ for 30 min, whereby there was obtained a thin film of completely polymerized polydiacetylene compounds. A second Al contact electrode was evaporated on the so-obtained thin film and the electrical resistance between the two electrodes was evaluated to be $10^{16} \Omega \cdot cm$, thus confirming the high insulating property of the thin film.

EXAMPLE 2

10,12-heptacosadiynic acid was dissolved in chloroform and the resulting solution of a diacetylene compound was dripped onto a water surface using a Langmuir-Blodgett apparatus to obtain a spread film. The chloroform was then evaporated off.

After the surface pressure was then adjusted to 35 dyne/cm, the spread film surface was irradiated with ultraviolet rays at 60 mW/cm$^2$ for 5 min. Twenty layers of the resulting incompletely polymerized thin film of 10,12-heptacosadiynic acid were then built up on a glass substrate, with the substrate transfer velocity at 2 mm/min for the first layer and 12 mm/min for the further layers. The measured absorption spectrum is shown in FIG. 1 (2). The substrate was then pattern-wise irradiated with ultraviolet rays, at 60 mW/cm$^2$ for 30 min. It was then immersed in a chloroform solution to remove the incompletely polymerized portions and obtain a patterned thin film of good quality.

EXAMPLE 3

Twenty layers of incompletely polymerized 10,12-heptacosadiynic acid were built up on a glass substrate by the method of Example 1. The substrate was then placed in an equipment vacuumized to $10^{-8}$ Torr and subjected to pattern-wise irradiation with an electron beam. It was then immersed in a chloroform solution to remove the incompletely polymerized portions and obtain a patterned thin film of good quality.

EXAMPLE 4

A single crystal substrate of n-type $Hg_{0.8}Cd_{0.2}Te$ was mechanically polished, then chemically etched with a methanol solution containing 1% of bromine, and then immersed in a pH 5.0 acetic acid-acetate buffer solution deaerated with $N_2$ and subjected to electrochemical cathodic reduction using a silver-silver chloride reference electrode and a platinum counter electrode, with potential sweeping rate at $-5$ mV/sec from the rest potential to $-0.8$ V, and with holding at $-0.8$ V until the current density fell to or below 1 $\mu A/cm^2$. The resulting substrate was washed and dried, whereafter indium was evaporated thereon to form contact electrodes with an area therebetween of 0.36 mm$^2$.

Next 10,12-heptacosadiynic acid selected as the diacetylene compound was dissolved in chloroform and this diacetylene compound solution was dripped onto a water surface using a Langmuir-Blodgett apparatus to obtain a spread film. The chloroform was then evaporated off, the surface pressure was adjusted to 35 dyne/cm, and ultraviolet rays were irradiated onto the spread film surface at 60 mW/cm$^2$ for 5 min, whereby there was obtained an incompletely polymerized spread film of 10,12-heptacosadiynic acid. Fifteen layers of the incompletely polymerized 10,12-heptacosadiynic acid were built up on the aforesaid semiconductor substrate provided with contact electrodes, with the substrate transfer velocity at 2 mm/min for the first layer and 12 mm/min for the further layers. The absorption spectrum of the built-up film is shown in FIG. 1 (2).

The substrate was then subjected to pattern-wise iradiation with ultraviolet rays at 60 mW/cm$^2$ for 30 min, through a mask that prevented irradiation of the contact electrode regions. As a result, there was formed a thin film of completely polymerized 10,12-heptacosadiynic acid at all parts of the substrate other than the contact electrode regions. The remaining incompletely polymerized portions were dissolved away with chloroform.

Figure 3:
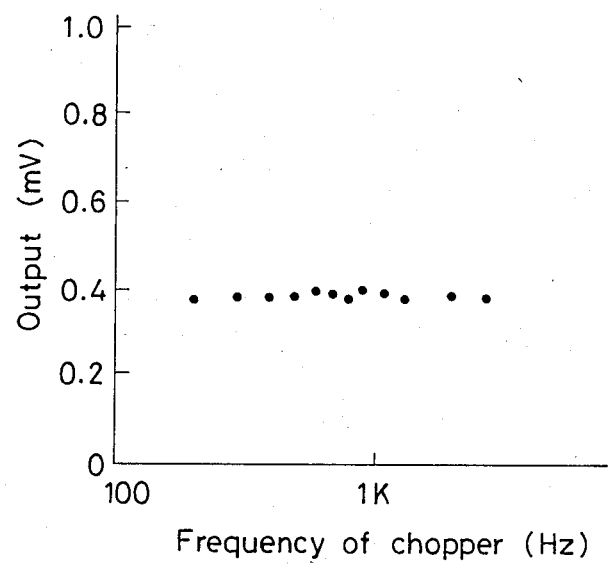
FIG. 3 shows a graph showing the response characteristics as an infrared detector constituted of a device according to this invention (an n-type $Cd_{0.2}Hg_{0.8}Te$ compound semiconductor).

After lead wires had been connected to the contact electrodes, infrared rays from a tungsten filament were irradiated onto the region between the electrodes through a chopper and a calcium fluoride filter, and the change in voltage at a fixed current of 5 mA was at measured at 77 K. The characteristics revealed by this measurement are shown in FIG. 3, from which it will be noted that the infrared detector device exhibited high performance.

COMPARATIVE EXAMPLE 1

10,12-heptacosadiynic acid was dissolved in chloroform and the resulting solution of the diacetylene compound was dripped onto a water surface using a Langmuir-Blodgett apparatus to obtain a spread film. The chloroform was then evaporated off.

After the surface pressure had been adjusted to 35 dyne/cm, five layers of the spread film were built up on a glass substrate provided with Al electrodes by evaporation, with the substrate transfer velocity set at 2 mm/min for the first layer and 12 mm/min for the further layers. The substrate was then irradiated with ultraviolet rays at 60 mW/cm$^2$ for 30 min to obtain a thin film of the polydiacetylene compound. Al contact electrodes were evaporated on the so-obtained thin film and the electrical resistance between the electrodes was measured. The electrical resistance of this thin film of polydiacetylene was found to vary between $10^2$ and $10^6 \Omega \cdot cm$ and this, in addition to the presence of pinholes, made it unsuitable for practical application.

COMPARATIVE EXAMPLE 2

A single crystal substrate of n-type $Hg_{0.8}Cd_{0.2}Te$ was mechanically polished, then chemically etched with a methanol solution containing 1% of bromine, and then immersed in a pH 5.0 acetic acid-acetate buffer solution deaerated with $N_2$ and subjected to electrochemical cathodic reduction using a silver-silver chloride reference electrode and a platinum counter electrode, with sweeping rate at $-5$ mV/sec from the rest potential and $-0.8$ V and with holding the potential at $-0.8$ V until the current density fell to or below 1 $\mu A/cm^2$. The resulting substrate was washed and dried, whereafter indium was evaporated thereon to form contact electrodes with an area therebetween of 0.36 mm$^2$.

Next 10,12-heptacosadiynic acid selected as a diacetylene compound was dissolved in chloroform and this diacetylene compound solution was dripped onto a water surface using a Langmuir-Blodgett apparatus to obtain a spread film. The chloroform was then evaporated off, the surface pressure was adjusted to 35 dyne/cm, and fifteen layers of the spread film were built up on the aforesaid semiconductor substrate provided with electrodes, with the substrate transfer velocity at 2 mm/min for the first layer and 12 mm/min for the further layers.

The substrate was then irradiated with ultraviolet rays at 60 mW/cm$^2$ for 30 min, through a mask that prevented irradiation of the electrode regions. As a result, there was formed a thin film of polydiacetylene compound at all parts of the substrate other than the electrode regions. The unirradiated portions were dissolved away with chloroform. The infrared ray response characteristics of the resulting device were examined in the same way as described in Example 4. The device exhibited defects in the film at an output of a mere 4 $\mu V$ and was unsuitable for practical application.

COMPARATIVE EXAMPLE 3

A single crystal substrate of n-type $Hg_{0.8}Cd_{0.2}Te$ was mechanically polished and then chemically etched with a methanol solution containing 1% of bromine. After the substrate had been washed and dried, indium was vapor deposited thereon to form electrodes with an area therebetween of 0.36 mm$^2$. Next 10,12-heptacosadiynic acid was dissolved in chloroform and this diacetylene compound solution was dripped onto a water surface using a Langmuir-Blodgett apparatus to obtain a spread film. The chloroform was then evaporated off, the surface pressure was adjusted to 35 dyne/cm, and fifteen layers of the spread film were built up on the aforesaid semiconductor substrate provided with electrodes, with the substrate transfer velocity set at 2 mm/min for the first layer and 12 mm/min for the further layers.

This substrate was then subjected to pattern-wise irradiation with ultraviolet rays at 60 mW/cm$^2$ for 30 min, through a mask that prevented irradiation of the electrode regions. As a result, there was formed a thin film of polydiacetylene compound at all parts of the substrate other than the electrode regions. The infrared ray response characteristics of the resulting device were examined in the same way as described in Example 4. While the resistance of the substrate was found to vary between 4.2 Ω at room temperature and 24Ω at 77 K, it was unresponsive to light and was not suitable for practical application.

By the method of this invention, in which a spread film of an incompletely polymerized diacetylene compound is transferred onto a substrate to build up a film and the film is thereafter completely polymerized into a thin film of polydiacetylene compound, it becomes possible to produce a resist material, an ultra-thin insulating film or an ultra-thin protective film which exhibits high density, high uniformity and high electrical insulating property as well as good amenability to patterning. In particular, when the invention is applied to build up a thin film of polydiacetylene compound on a mercury cadmium telluride or cadmium telluride semiconductor substrate which has been subjected to electrochemical cathode processing beforehand, the resulting thin film can serve as a passivation film and as a result it is possible to realize a semiconductor device exhibiting excellent electrical characteristics.

What is claimed is:

1. A method of producing a polydiacetylene thin film comprising spreading on a water surface a diacetylene compound having one or more conjugated diacetylene groups, a hydrophilic group at one end of the compound and a hydrophobic group at the other end of the compound, subjecting said diacetylene compound to incomplete polymerization by irradiation with ultraviolet rays to an extent incapable of causing complete polymerization, transferring said spread film to a substrate to form a monolayer or built-up film thereon, and irradiating said transferred film with ultraviolet rays or an electron beam to complete the polymerization thereof.

2. The method as claimed in claim 1 wherein the incompletely polymerized diacetylene compound obtained by irradiation with ultraviolet rays to an extent incapable of causing complete polymerization is soluble in solvents for said diacetylene compounds.

3. The method as claimed in claim 1 wherein the irradiation of the transferred film with ultraviolet rays or an electron beam to complete the polymerization thereof is carried out as pattern-wise irradiation and the remaining incompletely polymerized portions of the film are dissolved away with solvents to provide a patterned polydiacetylene thin film.

4. The method as claimed in claim 1 wherein the incompletely polymerized diacetylene compound obtained by irradiation with ultraviolet rays to an extent incapable of causing complete polymerization is transferred as a monolayer or a built-up film to a semiconductor substrate of mercury cadmium telluride or cadmium telluride which has been subjected to a surface cleaning treatment, the transferred monolayer or built-up film is pattern-wise irradiated with ultraviolet rays or an electron beam to completely polymerize the same, and the remaining incompletely polymerized portions thereof are dissolved away with solvents to provide the patterned polydiacetylene thin film on the substrate.

5. The method as claimed in claim 4 wherein said surface cleaning treatment is carried out by mechanically polishing and/or chemically etching the substrate and thereafter carrying out electrochemical cathodic reduction in a buffer solution deaerated with an inert gas and having a pH of 4 to 9.

6. The method as claimed in claim 2 wherein the irradiation of the transferred film with ultraviolet rays or an electron beam to complete the polymerization thereof is carried out as pattern-wise irradiation and the remaining incompletely polymerized portions of the film are dissolved away with solvents to provide a patterned polydiacetylene thin film.

7. The method according to claim 1 wherein said hydrophilic group is a —COOH group and the hydrophobic group is a —CH$_3$ group.

* * * * *